(12) United States Patent
Yang et al.

(10) Patent No.: US 8,003,524 B2
(45) Date of Patent: *Aug. 23, 2011

(54) PLATING SEED LAYER INCLUDING AN OXYGEN/NITROGEN TRANSITION REGION FOR BARRIER ENHANCEMENT

(75) Inventors: Chih-Chao Yang, Poughkeepsie, NY (US); Simon Gaudet, Montreal (CA) (US); Christian Lavoie, Ossining, NY (US); Shom Ponoth, Fishkill, NY (US); Terry A. Spooner, New Fairfield, CT (US)

(73) Assignee: International Business Machines Corporation, Armonk, NY (US)

( * ) Notice: Subject to any disclaimer, the term of this patent is extended or adjusted under 35 U.S.C. 154(b) by 374 days.

This patent is subject to a terminal disclaimer.

(21) Appl. No.: 12/177,309

(22) Filed: Jul. 22, 2008

(65) Prior Publication Data

US 2009/0155996 A1    Jun. 18, 2009

Related U.S. Application Data

(60) Continuation of application No. 11/682,581, filed on Mar. 6, 2007, now Pat. No. 7,498,254, which is a division of application No. 11/245,540, filed on Oct. 7, 2005, now Pat. No. 7,215,006.

(51) Int. Cl.
  *H01L 21/4763* (2006.01)
(52) U.S. Cl. ........ 438/639; 438/618; 438/625; 438/629; 257/E21.575; 257/E21.579; 257/E21.585
(58) Field of Classification Search .................. 438/650, 438/642
See application file for complete search history.

(56) References Cited

U.S. PATENT DOCUMENTS

| 6,037,258 | A | 3/2000 | Liu et al. |
|---|---|---|---|
| 6,329,021 | B1 | 12/2001 | Haug et al. |
| 6,395,642 | B1 | 5/2002 | Liu et al. |
| 6,441,492 | B1 | 8/2002 | Cunningham |
| 6,461,675 | B2 | 10/2002 | Paranjpe et al. |
| 6,525,428 | B1 | 2/2003 | Ngo et al. |
| 6,713,874 | B1 | 3/2004 | Hopper et al. |
| 6,977,224 | B2 | 12/2005 | Dubin et al. |
| 7,070,687 | B2 | 7/2006 | Chikarman et al. |
| 2005/0181555 | A1 | 8/2005 | Haukka et al. |
| 2005/0212139 | A1 | 9/2005 | Leinikka et al. |
| 2006/0063375 | A1* | 3/2006 | Sun et al. ................. 438/629 |
| 2006/0286797 | A1 | 12/2006 | Zhang et al. |

* cited by examiner

*Primary Examiner* — Cheung Lee
(74) *Attorney, Agent, or Firm* — Scully, Scott, Murphy & Presser, P.C.; Louis J. Percello, Esq.

(57) ABSTRACT

An interconnect structure which includes a plating seed layer that has enhanced conductive material, preferably, Cu, diffusion properties is provided that eliminates the need for utilizing separate diffusion and seed layers. Specifically, the present invention provides an oxygen/nitrogen transition region within a plating seed layer for interconnect metal diffusion enhancement. The plating seed layer may include Ru, Ir or alloys thereof, and the interconnect conductive material may include Cu, Al, AlCu, W, Ag, Au and the like. Preferably, the interconnect conductive material is Cu or AlCu. In more specific terms, the present invention provides a single seeding layer which includes an oxygen/nitrogen transition region sandwiched between top and bottom seed regions. The presence of the oxygen/nitrogen transition region within the plating seed layer dramatically enhances the diffusion barrier resistance of the plating seed.

13 Claims, 4 Drawing Sheets

PLATING SEED LAYER INCLUDING AN OXYGEN/NITROGEN TRANSITION REGION FOR BARRIER ENHANCEMENT

RELATED APPLICATION

This application is a continuation of U.S. application Ser. No. 11/682,581, filed on Mar. 6, 2007, now U.S. Pat. No. 7,498,254, which is a divisional of U.S. application Ser. No. 11/245,540 filed Oct. 7, 2005, now U.S. Pat. No. 7,215,006, issued on May 8, 2007.

FIELD OF THE INVENTION

The present invention relates to a semiconductor structure and a method of fabricating the same. More particularly, the present invention relates to an interconnect structure which includes a plating seed layer that comprises an oxygen/nitrogen transition region located between first and second plating regions. The plating seed layer of the present invention, which includes the oxygen/nitrogen transition region, dramatically increases the diffusion barrier resistance of the plating seed layer compared with prior art plating seed layers that do not include the oxygen/nitrogen transition region. The present invention also provides a method of fabricating such an interconnect structure.

BACKGROUND OF THE INVENTION

Generally, semiconductor devices include a plurality of circuits which form an integrated circuit fabricated on a semiconductor substrate. A complex network of signal paths will normally be routed to connect the circuit elements distributed on the surface of the substrate. Efficient routing of these signals across the device requires formation of multilevel or multilayered schemes, such as, for example, single or dual damascene wiring structures. The wiring structure typically includes copper, Cu, since Cu based interconnects provide higher speed signal transmission between large numbers of transistors on a complex semiconductor chip as compared with aluminum, Al-based interconnects.

Within a typical interconnect structure, metal vias run perpendicular to the semiconductor substrate and metal lines run parallel to the semiconductor substrate. Further enhancement of the signal speed and reduction of signals in adjacent metal lines (known as "crosstalk") are achieved in today's IC product chips by embedding the metal lines and metal vias (e.g., conductive features) in a dielectric material having a dielectric constant of less than 4.0.

In current interconnect structures, a layer of plasma vapor deposited (PVP) TaN and a PVP Cu seed layer are used as a Cu diffusion barrier and plating seed, respectively, for advanced interconnect applications. However, with decreasing critical dimension, it is expected that the PVD-based deposition techniques will run into conformality and coverage issues. These, in turn, will lead to fill issues at plating, such as center and edge voids, which cause reliability concerns and yield degradation.

One way around this problem is to reduce the overall thickness of PVD material, and utilize a single layer of liner material which serves as both the diffusion barrier and plating seed. Another way around the aforementioned issue is the use of chemical vapor deposition (CVD) or atomic layer deposition (ALD) which result in better step coverage and conformality as compared with conventional PVP techniques. CVD or ALD ruthenium, Ru, and iridium, Ir, have the potential of replacing current PVD based barrier/plating seed for advanced interconnect application.

However, Ru and Ir are not a good metal diffusion barrier as compared with TaN, and, as such, it would be necessary to enhance the barrier resistant of the plating seed. To date, there is no known prior art that provides an interconnect structure which includes a single Ru or Ir seed layer that has enhanced barrier properties, i.e., resistant to diffusion of an interconnect conductive material such as, for example, Cu, Al, AlCu, W, Ag, and Au.

SUMMARY OF THE INVENTION

In view of the problems mentioned herein above, the present application provides an interconnect structure which includes a plating seed layer that has enhanced conductive material, preferably, Cu, diffusion properties thus eliminating the need for utilizing separate diffusion and seed layers. Specifically, the present invention provides an oxygen/nitrogen transition region within a plating seed layer for interconnect metal diffusion enhancement. The plating seed layer may include Ru, Ir or alloys thereof and the interconnect conductive material may include Cu, Al, AlCu, W, Ag, Au and the like. Preferably, the interconnect conductive material is Cu or AlCu. In more specific terms, the present invention provides a single seeding layer which includes an oxygen/nitrogen transition region sandwiched between top and bottom seed regions. The presence of the oxygen/nitrogen transition region within the plating seed layer dramatically enhances the diffusion barrier resistance of the plating seed. It is noted that the inventive plating seed layer including the oxygen/nitrogen transition region sandwiched between bottom and top plating seed regions is an improvement over the prior art since a single plating seed layer can be used that has enhanced diffusion properties, yet is capable of serving as a plating seed layer. In the prior art, two separate layers including a diffusion barrier comprised of TaN, for example, and a metallic seed layer are used.

In broad terms, the plating seed layer of the present invention comprises:
an oxygen/nitrogen transition region located between bottom and top plating seed regions, said plating seed layer having a breakdown temperature of about 750° C. or greater for a film thickness of about 3 nm or greater.

In general terms, the present invention provides a semiconductor interconnect structure which includes:
a dielectric material including at least one opening therein;
a plating seed layer located within said at least one opening, said plating seed layer comprising an oxygen/nitrogen transition region located between top and bottom seed regions; and
an interconnect conductive material located within the at least one opening.

The at least one opening may include a line region, a line region and a via region or combinations thereof. Single and dual damascene interconnect structures are contemplated in the present invention. In accordance with the present invention, the plating seed layer is located on exposed wall portions of the dielectric material in which the said at least one opening is present. In some embodiments, the plating seed layer is removed from the via providing an open via structure. Closed via structures are also contemplated herein.

In more specific terms, the inventive structure comprises:
a dielectric material including at least one opening therein;

a Ru-containing plating seed layer located within said at least one opening comprising an oxygen/nitrogen transition region located between top and bottom Ru-containing seed regions; and a Cu interconnect metal located within the at least one opening.

In addition to providing an interconnect structure, the present invention is also related to a method of fabricating the same. In general terms, the method of the present application comprises:

forming at least one opening in a dielectric material;

forming a first plating seed region at least on exposed wall portions of said dielectric material within said at least one opening;

forming an oxygen/nitrogen transition region on said first plating seed region;

forming a second plating seed region on said oxygen/nitrogen transition region, wherein said first plating seed region, said oxygen/nitrogen transition region, and said second plating seed region define a single plating seed layer having barrier enhancement; and forming an interconnect conductive material within said at least one opening on said single plating seed layer.

In some embodiments of the present invention, a single deposition tool can be used to deposit the various regions of the inventive plating seed layer.

In more specific terms, the method of the present invention comprises:

forming at least one opening in a dielectric material;

forming a first Ru-containing plating seed region at least on exposed wall portions of said dielectric material within said at least one opening;

forming an oxygen/nitrogen transition region on said first Ru-containing plating seed region;

forming a second Ru-containing plating seed region on said oxygen/nitrogen transition region, wherein said first Ru-containing plating seed region, said oxygen/nitrogen transition region, and said second Ru-containing plating seed region define a single Ru-containing plating seed layer having barrier enhancement; and forming a Cu interconnect metal within said at least one opening on said single plating seed layer.

DETAILED DESCRIPTION OF THE INVENTION

The present invention, which provides an interconnect structure including a single plating seed layer having enhanced resistant to metal diffusion and a method of fabricating the same, will now be described in greater detail by referring to the following discussion and drawings that accompany the present application. The drawings of the present application, which are referred to herein below in greater detail, are provided for illustrative purposes and, as such, they are not drawn to scale.

Figure 1:
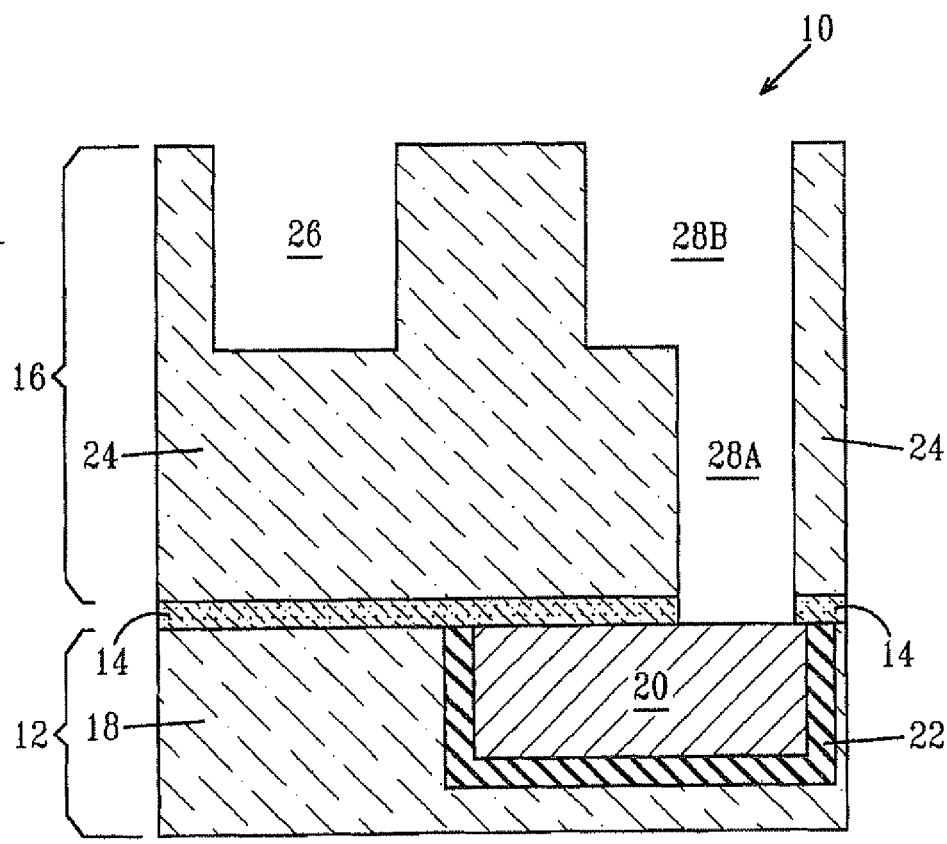
FIG. 1 is a pictorial representation (through a cross sectional view) illustrating an interconnect structure through initial stages of the inventive method wherein at least one opening is provided into a dielectric material.

The process flow of the present invention begins with providing the initial interconnect structure 10 shown in FIG. 1. Specifically, the initial interconnect structure 10 shown in FIG. 1 comprises a multilevel interconnect including a lower interconnect level 12 and an upper interconnect level 16 that are separated in part by dielectric capping layer 14. The lower interconnect level 12, which may be located above a semiconductor substrate including one or more semiconductor devices, comprises a first dielectric material 18 having at least one conductive feature (i.e., conductive region) 20 that is separated from the first dielectric material 18 by a barrier layer 22. The upper interconnect level 16 comprises a second dielectric material 24 that has at least one opening located therein. In FIG. 1, two openings are shown; reference number 26 denotes a line opening for a single damascene structure, and reference numeral 28A and 28B denote a via opening and a line opening, respectively for a dual damascene structure. Although FIG. 1 illustrates a separate line opening and an opening for a via and a line, the present invention also contemplates cases in which only the line opening is present or cases in which the opening for the combined via and line is present.

Figure 4:
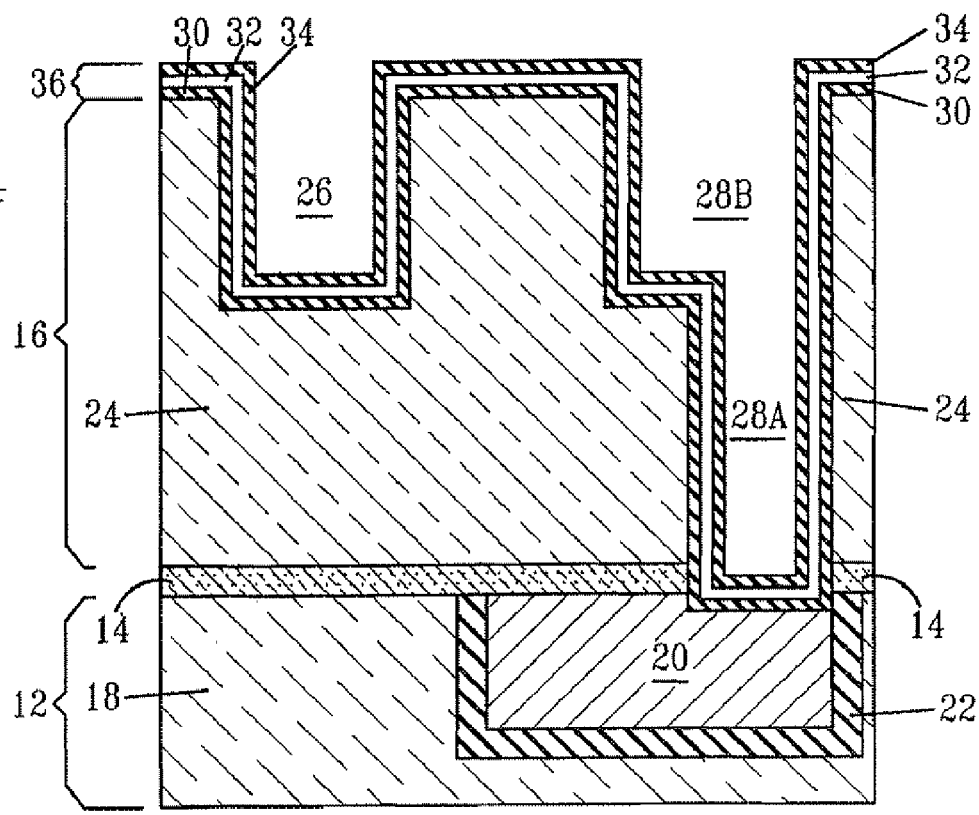
FIG. 4 is a pictorial representation (though a cross sectional view) illustrating the interconnect structure of FIG. 3 after forming the upper plating seed region of the inventive plating seed layer on the oxygen/nitrogen transition region.

It is also noted that although the plating seed layer 36, as shown in FIG. 4, of the present invention is shown in the upper interconnect level 16 it can also be present in other levels of the interconnect structure as well including, for example, the lower interconnect level 12. As such, the inventive plating seed layer can be present in any level of a single level or multilevel interconnect structure.

The initial interconnect structure 10 shown in FIG. 1 is made utilizing standard interconnect processing which is well known in the art. For example, the initial interconnect structure 10 can be formed by first applying the first dielectric material 18 to a surface of a substrate (not shown). The substrate, which is not shown, may comprise a semiconducting material, an insulating material, a conductive material or any combination thereof. When the substrate is comprised of a semiconducting material, any semiconductor such as Si, SiGe, SiGeC, SiC, Ge alloys, GaAs, InAs, InP and other III/V or II/VI compound semiconductors may be used. In addition to these listed types of semiconducting materials, the present invention also contemplates cases in which the semiconductor substrate is a layered semiconductor such as, for example, Si/SiGe, Si/SiC, silicon-on-insulators (SOIs) or silicon germanium-on-insulators (SGOIs).

When the substrate is an insulating material, the insulating material can be an organic insulator, an inorganic insulator or a combination thereof including multilayers. When the substrate is a conducting material, the substrate may include, for example, polySi, an elemental metal, alloys of elemental metals, a metal silicide, a metal nitride or combinations thereof including multilayers. When the substrate comprises a semiconducting material, one or more semiconductor devices such as, for example, complementary metal oxide semiconductor (CMOS) devices can be fabricated thereon.

The first dielectric material 18 of the lower interconnect level 12 may comprise any interlevel or intralevel dielectric including inorganic dielectrics or organic dielectrics. The first dielectric material 18 may be porous or non-porous. Some examples of suitable dielectrics that can be used as the first dielectric material 18 include, but are not limited to: $SiO_2$, silsesquioxane, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The first dielectric material 18 typically has a dielectric constant that is about 4.0 or less, with a dielectric constant of about 2.8 or less being even more typical. These dielectrics generally have a lower parasitic cross talk as compared with dielectric materials that have a higher dielectric constant than 4.0. The thickness of the first dielectric material 18 may vary depending upon the dielectric material used as well as the exact number of dielectrics within the lower interconnect level 12. Typically, and for normal interconnect structures, the first dielectric material 18 has a thickness from about 200 to about 450 nm.

The lower interconnect level 12 also has at least one conductive feature 20 that is embedded in (i.e., located within) the first dielectric material 18. The conductive feature 20 comprises a conductive region that is separated from the first dielectric material 18 by a barrier layer 22. The conductive feature 20 is formed by lithography (i.e., applying a photoresist to the surface of the first dielectric material 18, exposing the photoresist to a desired pattern of radiation, and developing the exposed resist utilizing a conventional resist developer), etching (dry etching or wet etching) an opening in the first dielectric material 18 and filling the etched region with the barrier layer 22 and then with a conducive material forming the conductive region. The barrier layer 22, which may comprise Ta, TaN, Ti, TiN, Ru, RuN, W, WN or any other material that can serve as a barrier to prevent conductive material from diffusing there through, is formed by a deposition process such as, for example, atomic layer deposition (ALD), chemical vapor deposition (CVD), plasma enhanced chemical vapor deposition (PECVD), sputtering, chemical solution deposition, or plating.

In some embodiments, not specifically shown herein, the barrier layer 22 of the lower interconnect level 12 may comprise the inventive plating seed layer, which will be described in greater detail herein below. The thickness of the barrier layer 22 may vary depending on the exact means of the deposition process as well as the material employed. Typically, the barrier layer 22 has a thickness from about 4 to about 40 nm, with a thickness form about 7 to about 20 nm being more typical.

Following the barrier layer 22 formation, the remaining region of the opening within the first dielectric material 18 is filled with a conductive material forming the conductive region. The conductive material used in forming the conductive region includes, for example, polySi, a conductive metal, an alloy comprising at least one conductive metal, a conductive metal silicide or combinations thereof. Preferably, the conductive material that is used in forming the conductive region is a conductive metal such as Cu, W or Al, with Cu or a Cu alloy (such as AlCu) being highly preferred in the present invention. The conductive material is filled into the remaining opening in the first dielectric material 18 utilizing a conventional deposition process including, but not limited to: CVD, PECVD, sputtering, chemical solution deposition or plating. After these depositions, a conventional planarization process such as chemical mechanical polishing (CMP) can be used to provide a structure in which the barrier layer 22 and the conductive feature 20 each have an upper surface that is substantially coplanar with the upper surface of the first dielectric material 18.

After forming the at least one conductive feature 20, the dielectric capping layer 14 is formed on the surface of the lower interconnect level 12 utilizing a conventional deposition process such as, for example, CVD, PECVD, chemical solution deposition, or evaporation. The dielectric capping layer 22 comprises any suitable dielectric capping material such as, for example, SiC, $Si_4NH_3$, $SiO_2$, a carbon doped oxide, a nitrogen and hydrogen doped silicon carbide SiC(N, H) or multilayers thereof. The thickness of the capping layer 22 may vary depending on the technique used to form the same as well as the material make-up of the layer. Typically, the capping layer 22 has a thickness from about 15 to about 55 nm, with a thickness from about 25 to about 45 nm being more typical.

Next, the upper interconnect level 16 is formed by applying the second dielectric material 24 to the upper exposed surface of the capping layer 22. The second dielectric material 24 may comprise the same or different, preferably the same, dielectric material as that of the first dielectric material 18 of the lower interconnect level 12. The processing techniques and thickness ranges for the first dielectric material 18 are also applicable here for the second dielectric material 24. Next, at least one opening is formed into the second dielectric material 24 utilizing lithography, as described above, and etching. The etching may comprise a dry etching process, a wet chemical etching process or a combination thereof. The term "dry etching" is used herein to denote an etching technique such as reactive-ion etching, ion beam etching, plasma etching or laser ablation. In FIG. 1, two openings are shown; reference number 26 denotes a line opening for a single damascene structure, and reference numeral 28A and 28B denote a via opening and a line opening, respectively for a dual damascene structure. It is again emphasized that the present invention contemplates structures including only opening 26 or openings 28A and 28B.

In the instances when a via opening 28A and a line opening 28B are formed, the etching step also removes a portion of the dielectric capping layer 22 that is located atop the conductive feature 20.

Figure 2:
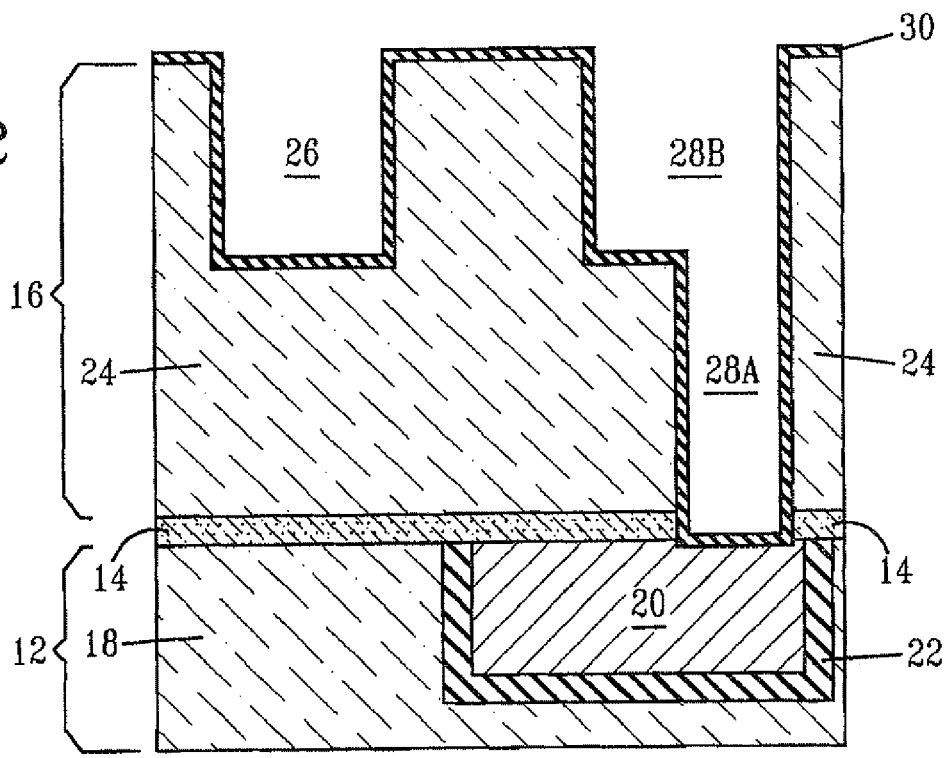
FIG. 2 is a pictorial representation (through a cross sectional view) illustrating the interconnect structure of FIG. 1 after providing the bottom plating seed region of the inventive plating seed layer on exposed surfaces of the dielectric material including the wall portions within the at least one opening.

Next, a portion of the inventive plating seed layer having the improved barrier resistance properties is provided by forming a bottom plating seed region 30 on exposed surfaces (including wall surfaces within the opening) on the second dielectric material 24. The resultant structure is shown, for example, in FIG. 2. The bottom plating seed region 30 comprises a material that has both diffusion barrier (albeit relatively poor) and plating seed properties. Examples of such materials for the bottom plating seed region 30 comprise a Ru-containing material, an Ir-containing material or mixtures thereof. For example, the lower plating seed region 30 may comprise Ru, a combination of TaN and Ru, a combination of TiSiN and Ru, Ir, a combination of TaN and Ir, a combination of TiSiN and Ir. Preferably, bottom seeding region 30 comprises Ru or Ir, with Ru being highly preferred.

The bottom plating seed region 30 of the plating seed layer of the present invention is formed utilizing a conventional deposition process such as, for example, ALD, CVD, PECVD, chemical solution deposition and other like deposition processes in which a Ru-containing precursor and/or an Ir-containing precursor are used in the deposition of the bottom plating seed region 30.

Figure 3:
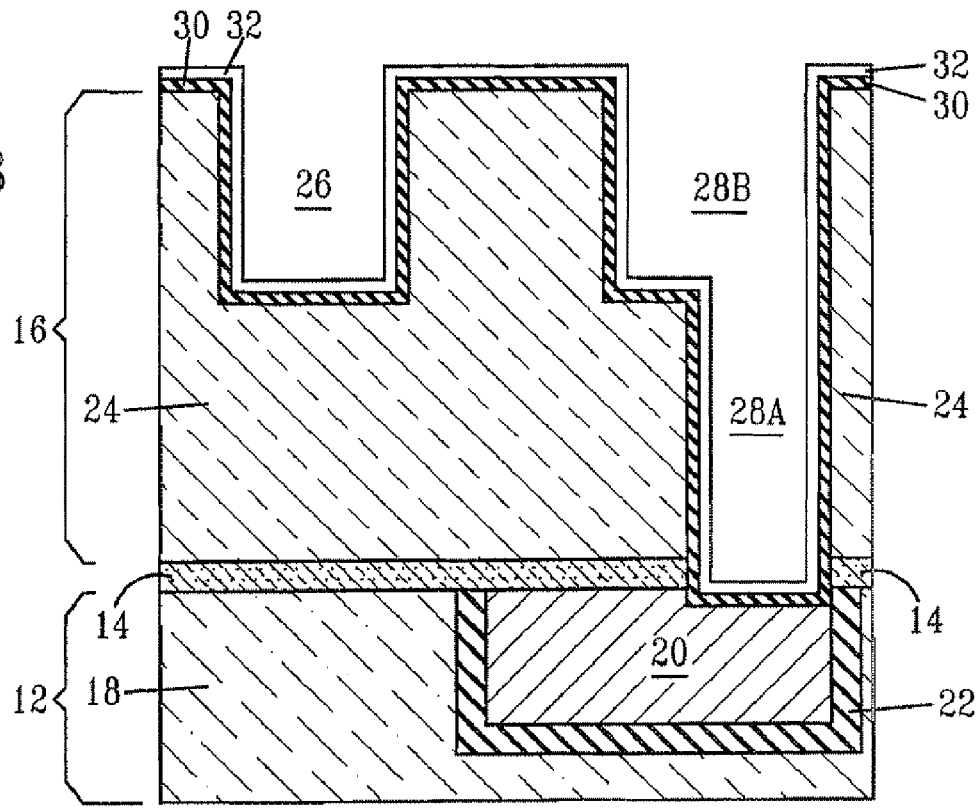
FIG. 3 is a pictorial representation (through a cross sectional view) illustrating the interconnect structure of FIG. 2 after forming the oxygen/nitrogen transition region of the inventive plating seed layer on the bottom plating seed region.

After forming the bottom plating seed region 30, an oxygen/nitrogen transition region 32 is formed atop the bottom plating seed region 30. The resultant structure is shown, for example, in FIG. 3. The term "oxygen/nitrogen transition region" is used throughout the instant application to denote a region of the plating seed layer that has a higher oxygen and/or nitrogen content than either the bottom plating seed region 30 and the upper plating seed region 34 (to be subsequently formed). Typically, the oxygen/nitrogen transition region 32 has an oxygen/nitrogen content that is greater than 2× more than the bottom plating seed region 30 and the upper plating seed region 34. More typically, the oxygen/nitrogen transition region 32 has an oxygen/nitrogen content that is greater than 5× more than the bottom plating seed region 30 and the upper plating seed region 34. The thickness of the oxygen/nitrogen transition region 32 varies depending on the conditions used to form the same. Typically, the oxygen/nitrogen transition region 32 has a thickness from about 0.5 to about 5 nm, with a thickness from about 1 to about 2 nm being more typical.

The oxygen/nitrogen transition region 32 can be formed utilizing two techniques. In a first technique, the structure including the bottom plating seed region 30 is exposed to an ambient (gas or plasma) including $O_2$ and/or $N_2$. Examples of such ambients include, air, ozone, $O_2$, NO, $N_2O$, $NH_3$, $N_2H_2$ or mixtures thereof. The treatment can be performed at nominal room temperature (i.e., a temperature from about 20° C. to about 40° C.) or at an elevated temperature of greater than 40° C. This step forms a region that is rich in oxygen and/or nitrogen. For example, when Ru is used as the bottom plating seed region 30, the oxygen/nitrogen transition region 32 may comprise one of RuO, RuON or RuN.

In a second embodiment, the oxygen/nitrogen transition region 32 is formed atop the bottom plating seed region 30 by changing the precursors used in forming the bottom plating seed region 30 so as to be rich in oxygen and/or nitrogen. The term "rich" is used to denote that the precursors are switched so that the content of oxygen and/or nitrogen is within the ranges mentioned above. The embodiment is advantageous since a single deposition tool can be used in forming both the diffusion barrier layer and the plating seed layer of the present invention. It is noted in the prior art different materials, i.e. TaN and Cu seed, are required as barrier and seed layers, respectively. In the present invention, barrier and seeding properties are achieved utilizing a single layer. Moreover, in the present invention shorter process time and lower process cost as compared to the conventional process are achieved.

FIG. 4 shows the resultant structure formed after forming a top plating seed region 34 of the inventive plating seed layer on the oxygen/nitrogen transition region 32. The top plating seed region 34 may comprise the same or different, preferably the same, material as that of the bottom plating seed region 30. The top plating seed region 34 is formed utilizing the techniques described above in forming the bottom plating seed region 30 and the thickness of the top plating seed region 34 is within the ranges provided above for the bottom plating seed region 30.

It is noted that regions 30, 32 and 34 form a single plating seed layer 36 that has plating seed properties (due to regions 30 and 34) and enhanced diffusion resistance (due to region 32). The enhanced diffusion properties are relative to a plating seed layer that does not contain the inventive oxygen/nitrogen transition region 32. An enlarged view of the inventive plating seed layer 36 is shown in FIG. 7.

Figure 5:
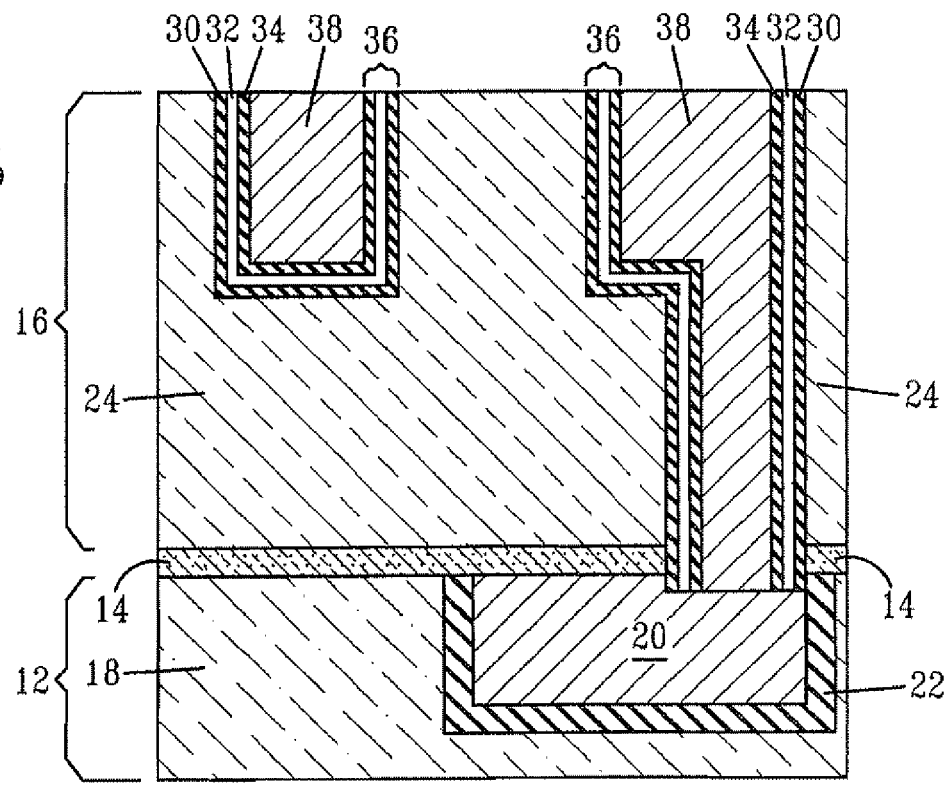
FIG. 5 is pictorial representation (through a cross sectional view) illustrating the structure of FIG. 4 after opening the bottom of the via and forming an interconnect conductive material within said at least one opening.
Figure 6:
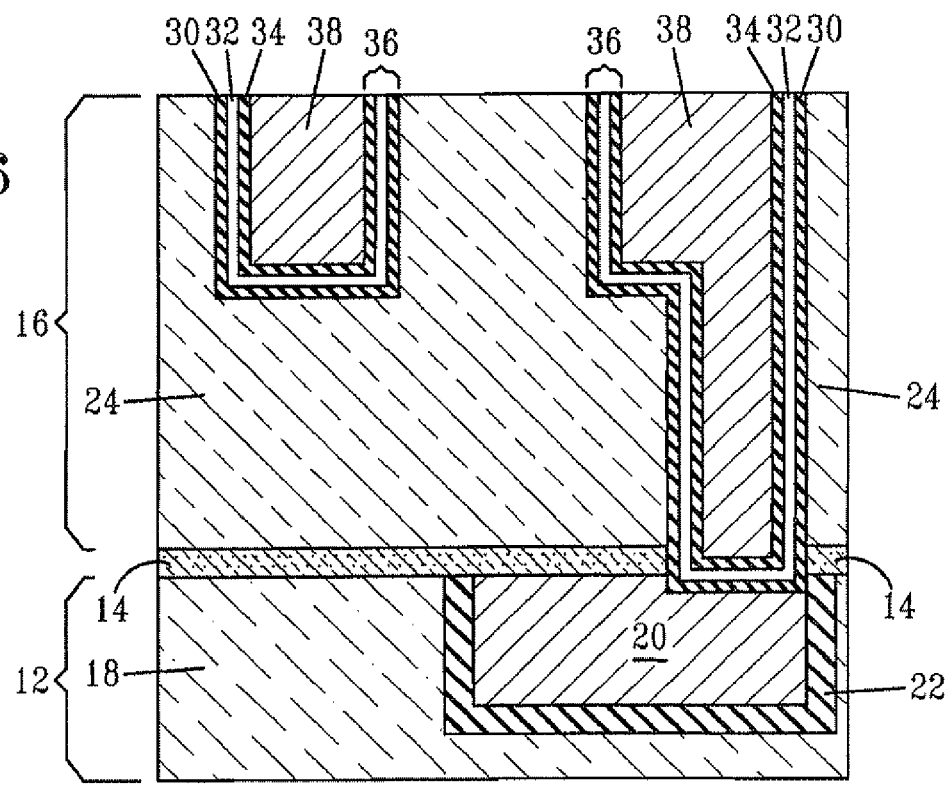
FIG. 6 is a pictorial representation (through a cross sectional view) illustrating the structure of FIG. 4 after forming an interconnect conductive material within said at least one opening.

FIG. 5 shows the structure after opening the bottom of the via and forming an interconnect conductive material 38 within said at least one opening. The structure shown in FIG. 5 represents one possible embodiment of the present invention, while the structure shown in FIG. 6 represents another possible embodiment of the present invention. In FIG. 6, the interconnect conductive material 38 is formed within a closed via structure. The open via structure is formed by removing the plating seed layer 36 from the bottom of via 28A utilizing ion bombardment or another like directional etching process. In the open via structure, the interconnect conductive material 38 is in contact with a surface of the at least one conductive feature 20.

In both structures, the interconnect conductive material 38 may comprise the same or different, preferably the same, conductive material as that of the conductive feature 20. Preferably, Cu, Al, W or alloys thereof are used, with Cu or AlCu being most preferred. The conductive material 38 is formed utilizing the same deposition processing as described above in forming the conductive feature 20 and following deposition of the conductive material, the structure is subjected to planarization. Note that in FIGS. 5 and 6, the upper surfaces of the second dielectric material 24, the plating seed layer 36 and the conductive material 38 are all substantially coplanar.

Figure 7:
FIG. 7 is a pictorial representation (through a cross sectional view) showing an enlarged view of the inventive plating seed layer that includes an oxygen/nitrogen transition region located between bottom and top plating seed regions.
Figure 8:
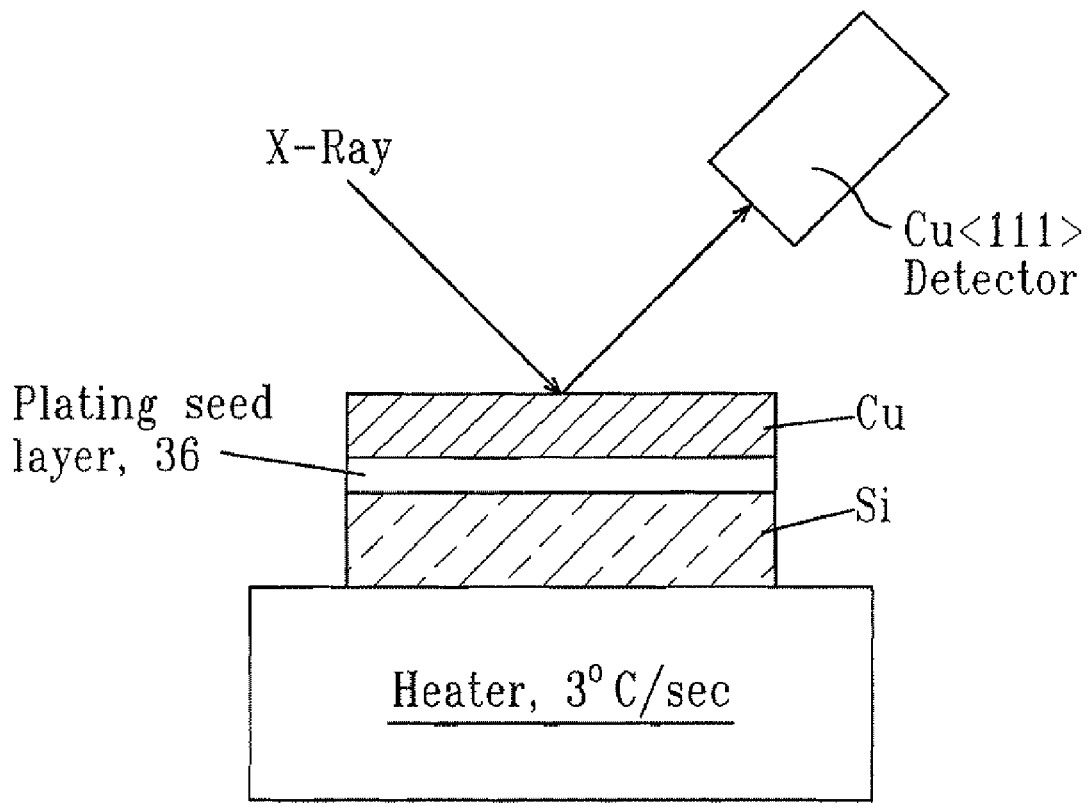
FIG. 8 is a pictorial representation (through a cross sectional view) illustrating the method used to define the breakdown temperature.

As indicated above, FIG. 7 is a pictorial representation showing an enlarged view of the inventive plating seed layer 36 that includes the oxygen/nitrogen transition region 32 located between bottom and top plating seed regions, 30 and 34, respectively. It is again emphasized that the inventive plating seed layer 36 can serve as both the plating seed as well as the diffusion barrier since the presence of the oxygen/transition seed region 32 enhances the diffusion resistance of the overall plating seed layer 36. Typically, the plating seed layer 36 including the oxygen/nitrogen transition region 32 located between bottom and top plating seed regions (reference numerals 30 and 34, respectively) has a breakdown temperature of about 750° C. or greater for a layer having thickness of about 3 nm or greater. The breakdown temperature is a measurement that is performed to determine a film's potential breakdown when exposed to high temperatures. The breakdown of the film is caused by diffusion of interconnect conductive material, especially Cu, through the barrier layer. Diffusion barrier failure is determined by using a X-ray diffraction technique to monitor the Cu <111> diffraction peak on a Si/Diffusion barrier/Cu film stack, as shown in FIG. 8. The Cu <111> diffraction peak disappears when Cu diffuses through the barrier layer, and Cu silicide is formed. Without a layer of barrier material between Cu and Si, this reaction typically occurs by 250° C. The Cu diffusion breaking down temperature is higher for the Ru stack with an oxygen/nitrogen transition region than the stack without the transition region. For a layer having thickness of 3 nm, with an embedded oxygen/nitrogen transition layer of about 0.5 nm, the breakdown temperature is greater than 750° C.; however, without the transition region layer the breakdown temperature is below 500° C.

For example, applicants have provided a 3 nm plating seed layer including the oxygen/nitrogen transition region as described above and have determined its breakdown temperature relative to that of a prior art 3 nm plating seed layer not including the inventive oxygen/nitrogen transition region. Applicants have determined that the breakdown temperature for the inventive plating seed layer was about 750° C. or above, while the breakdown temperature for the prior art plating seed layer, absent said oxygen/nitrogen transition region, was about 500° C. Hence, the inventive plating seed layer exhibited improved barrier resistance as compared with a typical prior art plating seed layer.

While the present invention has been particularly shown and described with respect to preferred embodiments thereof; it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of forming an interconnect structure comprising:
    foaming at least one opening in a dielectric material;
    forming a first plating seed region at least on exposed wall portions of said dielectric material within said at least one opening;
    forming an oxygen/nitrogen transition region on said first plating seed region, wherein said forming the oxygen/nitrogen transition region consists of exposing the first plating seed region to an ambient of oxygen, nitrogen, or oxygen and nitrogen;
    forming a second plating seed region on said oxygen/nitrogen transition region without performing any intermediate step, wherein said first plating seed region, said oxygen/nitrogen transition region, and said second plating seed region define a single plating seed layer having barrier enhancement; and
    forming an interconnect conductive material within said at least one opening on said single plating seed layer.

2. The method of claim 1 wherein said foaming said at least one opening comprises lithography and etching one of a line opening, a via opening and a line opening or a combination of said openings.

3. The method of claim 1 wherein said forming said first and second plating seed regions comprises the same or different deposition process.

4. The method of claim 1 wherein said forming said oxygen/nitrogen transition comprises treating said first plating seed region in an ambient comprises oxygen, nitrogen or a combination thereof.

5. The method of claim 4 wherein said ambient comprises air.

6. The method of claim 1 wherein said forming said oxygen/transition region comprises switching a precursor used in forming said first plating seed region to have a higher oxygen, nitrogen or combined oxygen and nitrogen content than said first plating seed region.

7. The method of claim 1 wherein said interconnect conductive material and said plating seed layer are planarized to provide a structure having upper surfaces of said interconnect conductive material and said plating seed layer that are substantially coplanar with an upper surface of the dielectric material.

8. The method of claim 1 wherein said forming said interconnect conductive material comprises a step of removing said plating seed layer from a bottom via.

9. The method of claim 1 wherein nitrogen is employed as said ambient and said oxygen/nitrogen transition region has a higher content of nitrogen that said first plating seed region.

10. The method of claim 1 wherein oxygen and nitrogen are employed as said ambient and said oxygen/nitrogen transition region has a higher content of oxygen and nitrogen that said first plating seed region.

11. A method of forming an interconnect structure comprising:
    forming at least one opening in a dielectric material;
    forming a first Ru-containing plating seed region at least on exposed wall portions of said dielectric material within said at least one opening;
    forming an oxygen/nitrogen transition region on said first Ru-containing plating seed region, wherein said forming the oxygen/nitrogen transition region consists of exposing the first plating seed region to an ambient of oxygen, nitrogen, or oxygen and nitrogen;
    forming a second Ru-containing plating seed region on said oxygen/nitrogen transition region without performing any intermediate step, wherein said first Ru-containing plating seed region, said oxygen/nitrogen transition region, and said second Ru-containing plating seed region define a single Ru-containing plating seed layer having barrier enhancement; and
    forming a Cu interconnect metal within said at least one opening on said single plating seed layer.

12. The method of claim 11 wherein forming said Cu interconnect metal comprises a step of removing said plating seed layer from a bottom via.

13. A method of forming an interconnect structure comprising:
    forming at least one opening in a dielectric material;
    forming a first plating seed region at least on exposed wall portions of said dielectric material within said at least one opening;
    forming an oxygen/nitrogen transition region on said first plating seed region, wherein the forming of the oxygen/nitrogen transition region includes switching a first precursor used in forming the first plating seed region to a second precursor that has higher content of oxygen, nitrogen or both oxygen and nitrogen than the first precursor;
    forming a second plating seed region on said oxygen/nitrogen transition region, wherein said first plating seed region, said oxygen/nitrogen transition region, and said second plating seed region define a single plating seed layer having barrier enhancement; and
    forming an interconnect conductive material within said at least one opening on said single plating seed layer.

* * * * *